United States Patent
Barth et al.

(10) Patent No.: US 6,726,996 B2
(45) Date of Patent: Apr. 27, 2004

(54) LAMINATED DIFFUSION BARRIER

(75) Inventors: Edward Paul Barth, Ridgefield, CT (US); Stephan A. Cohen, Wappingers Falls, NY (US); Chester Dziobkowski, Hopewell Junction, NY (US); John Anthony Fitzsimmons, Poughkeepsie, NY (US); Stephen McConnell Gates, Ossining, NY (US); Thomas Henry Ivers, Hopewell Jct, NY (US); Sampath Purushothaman, Yorktown Heights, NY (US); Darryl D. Restaino, Modena, NY (US); Horatio Seymour Wildman, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 298 days.

(21) Appl. No.: 09/858,687

(22) Filed: May 16, 2001

(65) Prior Publication Data

US 2002/0172811 A1 Nov. 21, 2002

(51) Int. Cl.⁷ ................................................. B32B 3/00
(52) U.S. Cl. ........................ 428/446; 428/209; 428/447; 428/450; 428/458; 428/469; 428/689; 428/697; 428/698; 428/702
(58) Field of Search .................................. 428/209, 408, 428/446, 450, 447, 458, 689, 697, 698, 702, 469

(56) References Cited

U.S. PATENT DOCUMENTS

| | | |
|---|---|---|
| RE34,887 E | 3/1995 | Ushifusa et al. |
| 5,798,563 A | 8/1998 | Feilchenfeld et al. |
| 5,834,357 A | 11/1998 | Kang |
| 6,013,357 A | 1/2000 | Sakuraba et al. |
| 6,078,493 A | 6/2000 | Kang |
| 6,368,899 B1 * | 4/2002 | Featherby et al. .......... 438/127 |

* cited by examiner

Primary Examiner—Deborah Jones
Assistant Examiner—Ling Xu
(74) Attorney, Agent, or Firm—Scully, Scott, Murphy & Presser; Jay H. Anderson

(57) ABSTRACT

A diffusion barrier that has a low dielectric constant, k, yet resistant to oxygen and/or moisture permeability is provided. The diffusion barrier includes a dielectric stack having at least two or more dielectric films, each film having a dielectric constant of about 8 or less, wherein the dielectric stack comprises alternating films composed of a high-permeability material and a low-permeability material. A semiconductor structure including substrate having at least one wiring region and the inventive diffusion barrier formed on a surface of the substrate is also provided.

19 Claims, 1 Drawing Sheet

LAMINATED DIFFUSION BARRIER

FIELD OF THE INVENTION

The present invention relates to semiconductor devices, and more particularly to a laminated diffusion barrier that has a low-dielectric constant, k, yet is resistant to oxygen and/or moisture permeability. Specifically, the present invention is directed to a laminated diffusion barrier that comprises alternating layers of high-permeability, i.e., high-affinity, dielectric films and low-permeability, i.e., low-affinity, dielectric films. The inventive diffusion barrier is particularly useful as a dielectric capping layer for interconnect structures that include wiring regions that are surrounded by organic interlevel dielectrics, or porous dielectrics (including organic and inorganic).

BACKGROUND OF THE INVENTION

Presently in integrated circuit (IC) manufacturing, the wiring in chip level interconnects and the device itself is normally protected from oxygen and moisture by various layers of inorganic dielectrics consisting of oxides such as $SiO_2$ or nitrides such as $Si_3N_4$. The inorganic dielectrics are typically formed on the surface of an interconnect structure which includes various wiring regions that are surrounded by various dielectric levels. For example, today's advanced chips typically have 6–8 levels of metal wiring and thus of dielectric material.

In addition to being effective as oxygen and/or moisture barrier layers, inorganic dielectrics are also excellent barriers against the migration of ions which can be present as contaminants or in processing fluids such as chemical etchant solutions. Such ions may corrode the metal wiring as well as migrate to the semiconductor itself wherein the migrating ions may either form silicides that may essentially destroy the semiconductor device, or may cause undesirable ionic currents. Another further problem involves copper atoms or ions which are not contained in the patterned copper wiring features (i.e., line and vias), and cause undesirable electrical contact (leakage) between the patterned copper features.

Despite being successful in preventing the diffusion of oxygen and moisture, barrier layers composed of inorganic dielectrics increase the effective dielectric constant of interconnect structures. This is because many of the interconnect structures used today contain low density dielectrics (including organic and inorganic dielectrics), which have dielectric constants that are less than $SiO_2$, as the interlevel dielectrics. The use of low-density dielectrics as the interlevel dielectrics provides faster operating devices because of the reduced signal delay.

An apparent solution to the mismatch problem caused by using an inorganic-containing diffusion barrier with an IC structure that contains a low-density dielectric as the interlevel dielectric is to switch to a laminated diffusion barrier. Low-density dielectrics tend to be permeable to moisture and other contaminants. This permeability problem is particularly detrimental to Cu wiring which can readily oxidize in the presence of moisture.

In view of the drawbacks mentioned above with prior art diffusion barriers, there is a continued need for providing a new and improved diffusion barrier that has a low-k, yet is resistant to oxygen and/or moisture.

SUMMARY OF THE INVENTION

One object of the present invention is to provide a diffusion barrier that has a low-dielectric constant, k, associated therewith. The term "low-k" denotes dielectric materials that have a dielectric constant of about 8 or less, preferably from about 3 to about 5.

Another object of the present invention is to provide a diffusion barrier that is resistant to oxygen and/or moisture permeability.

A further object of the present invention is to provide a diffusion barrier that is compatible with existing interconnect structures.

A yet further object of the present invention is to provide a diffusion barrier which does not sufficiently increase the effective dielectric constant of an underlying interconnect structure which contains a low-k organic dielectric as the interlevel dielectric.

These and other objects and advantages are achieved in the present invention by providing a diffusion barrier that includes very thin (on the order of 12 nm or less) alternating layers of high-permeability, i.e., high-affinity, and low-permeability, i.e., low-affinity, dielectric films. The term "high-permeability" denotes a dielectric film in which oxygen and/or moisture can readily diffuse into, whereas the term "low-permeability" denotes a film that retards the diffusion of oxygen and/or moisture. By providing a stack of two or more of the alternating high-permeability and low-permeability films, it is possible to retard the diffusion of oxygen and/or moisture to the underlying interconnect structure.

Without wishing to be bound by any theory, it is believed that the high-permeability dielectric allows lateral diffusion of oxygen and/or moisture so that the resulting concentration of oxygen and/or moisture at the low-permeability film is lower than at the high-permeability film. With multiple alternating layers, the concentration gradient of oxygen/moisture becomes less and less. In addition to lowering the concentration gradient by dilution within the high-permeability dielectric film (i.e., the diffusion within the high-permeability film is greater than that of the low-permeability film such that lateral diffusion with the high-permeability film results in dilution of the forward concentration gradient imposed upon the low-permeability film), the chemical affinity of the high-permeability film for oxygen/moisture also removes some of the oxygen/moisture through irreversible reaction.

Specifically, the inventive diffusion barrier comprises a dielectric stack having at least two or more dielectric films, each film having a dielectric constant of about 8 or less, wherein said dielectric stack comprises alternating films composed of a high-permeability material and a low-permeability material, said high-permeability material is formed on said low-permeability material.

In one embodiment of the present invention, the diffusion barrier includes a stack of three to five dielectric films which comprises alternating layers of low-density Si, C, H or Si, C, O, H amorphous films, as the high-permeability material, formed on $Si_3N_4$ or $Al_2O_3$, as the low-permeability material. In yet another embodiment of the present invention, the diffusion barrier comprises a stack of twelve dielectric films. In this embodiment, each layer comprises a Si, C and H containing amorphous alloy, with O and N as optional elements.

Another aspect of the present invention relates to a semiconductor structure such as an interconnect structure which includes the diffusion barrier formed thereon. Specifically, the inventive semiconductor structure comprises a substrate having at least one metal region formed therein and a diffusion barrier formed on a surface of said substrate, wherein said diffusion barrier comprises a dielectric stack having at least two or more dielectric films, each film having a dielectric constant of about 8 or less, wherein said dielectric stack comprises alternating films composed of a high-permeability material and a low-permeability material, said high-permeability material is formed on said low-permeability material.

A yet further aspect of the present invention relates to a method of fabricating the inventive diffusion barrier. Specifically, the inventive method comprises forming a dielectric stack having at least two or more dielectric films on a surface of a substrate containing at least one metal wiring region, each film having a dielectric constant of about 8 or less, wherein said dielectric stack comprises alternating films composed of a high-permeability material and a low permeability material, said high-permeability material is formed on said low-permeability material.

The forming step may occur in a single deposition reaction chamber or multiple deposition reaction chambers may be employed. Moreover, the forming step may include one or more of the following deposition processes: chemical vapor deposition (CVD), low-pressure CVD, plasma-assisted CVD, atomic layer deposition (ALD), evaporation, spin coating, chemical solution deposition or sputtering.

DETAILED DESCRIPTION OF THE INVENTION

Figure 1:
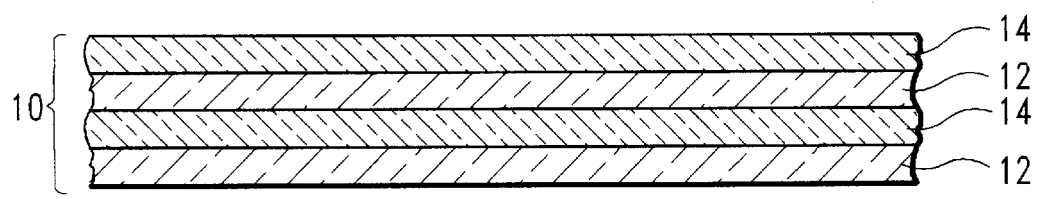
FIG. 1 is a cross-sectional view of one possible diffusion barrier of the present invention.

The present invention which provides a diffusion barrier that has a low-k, yet is resistant to oxygen and/or moisture permeability will now be described in more detail by referring to the drawings that accompany the present application. In the accompanying drawings, like and/or corresponding elements are referred to by like reference numerals.

As stated above, the present invention is directed to a diffusion barrier comprising a dielectric stack having at least two or more dielectric films, each film having a dielectric constant of about 8 or less, wherein said dielectric stack comprises alternating films composed of a high-permeability material and a low-permeability material, said high-permeability material is formed on said low-permeability material.

Figure 2:
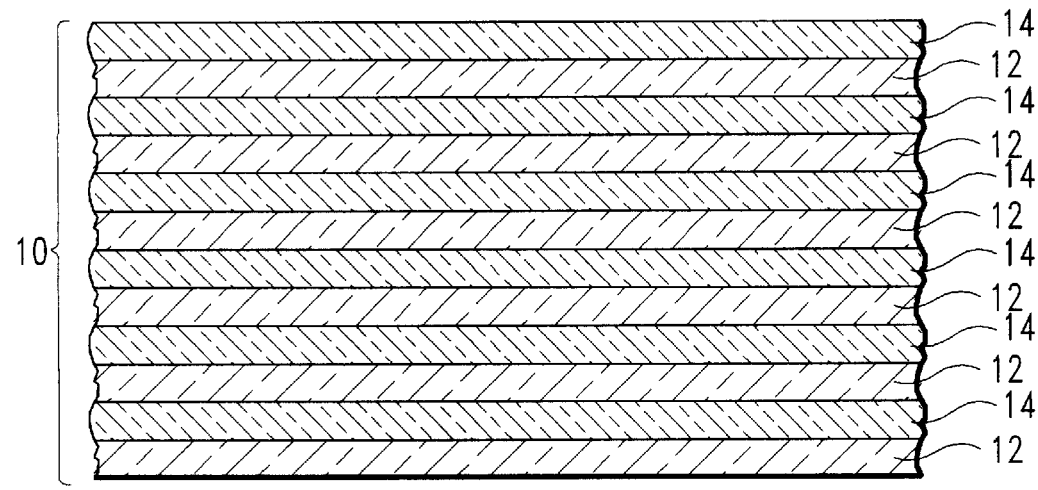
FIG. 2 is a cross-sectional view of another possible diffusion barrier of the present invention.

Reference is first made to FIGS. 1 and 2 which illustrate some preferred diffusion barriers of the present invention. Specifically, FIG. 1 illustrates a diffusion barrier which comprises dielectric stack 10 that has four sub-dielectric film layers. The four sub-dielectric film layers of the dielectric stack shown in FIG. 1 include alternating layers of high-permeability material 14 formed on low-permeability material 12.

FIG. 2 shows another preferred diffusion barrier that comprises dielectric stack 10 including twelve sub-dielectric film layers. The twelve sub-dielectric film layers of the dielectric stack in FIG. 2 include alternating layers of high-permeability material 14 formed on low-permeability material 12.

It is noted that although the drawings depict diffusion barriers that include four and twelve sub-dielectric film layers, the present invention is not limited to just those diffusion barriers. Instead, the present invention contemplates diffusion barriers that include at least two sub-dielectrics layers, i.e., a high-permeability material formed on a low-permeability material. In some embodiments, a dielectric stack containing three dielectric layers is preferred.

Notwithstanding the number of sub-dielectric film layers used in making the inventive diffusion barrier, the high-permeability material employed in the present invention includes any low-density dielectric that has a high-affinity for diffusing oxygen and/or moisture through the film. The high-permeability dielectric films may be organic dielectrics that have a dielectric constant of less than about 4, preferably from about 2 to about 3.5. Alternatively, the high-permeability dielectrics may be amorphous films comprised of Si, C, H, and optionally including O and/or N.

Illustrative examples of suitable low-density dielectrics that can be employed in the present invention as the high-permeability dielectric include, but not limited to: polyarylene ethers; thermosetting polyarylene ethers; aromatic thermosetting resins such as the SiLK® (semiconductor dielectric from Dow Chemical Company); polyimides; Si-containing polymers such as hydrogensilsesquioxanes, organosilsesquioxanes, a:SiC:H or SiCOH; benzocyclobutenes; polynorboranes; parylene copolymers; parylene-F; polynapthalene; polytetrafluoronaphthalene; poly(octafluoro-bis-benzocyclobutene); Telfon-AF; fluorinated-amorphous carbon; Xerogels and nanoporous silica. Of these dielectrics, it is preferred that the high permeability dielectric be composed of a:SiC:H or SiCOH, and optionally containing N also. Note a:SiC:H denotes an amorphous alloy of Si, C, and H.

When more than one high-permeability dielectric film is employed, the high-permeability films of the dielectric stack may comprise the same or different low density dielectric, with preference given to using the same low density dielectric as the high-permeability dielectric in the dielectric stack. The thickness of each high-permeability dielectric film present in the diffusion barrier of the present invention is typically about 12 nm or less, with a thickness for each high-permeability dielectric of from about 5 to about 10 nm being more highly preferred.

Insofar as the other component of the dielectric stack is concerned, i.e., the low-permeability dielectric film, the present invention contemplates the use of any dielectric which has a low-diffusion rate for oxygen and/or moisture. That is, the low-permeability films of the present invention are composed of dielectrics that have low-affinity for diffusing oxygen and/or moisture through it. In the present invention, the low-permeability dielectric films are preferably composed of inorganic dielectrics that have a dielectric constant, k, of less or equal to silicon nitride, i.e., $Si_3N_4$.

Illustrative examples of dielectrics that can be employed in the present invention as the low-permeability dielectric include, but are not limited to: $Si_3N_4$; amorphous Si, N, H alloys; $Al_2O_3$; amorphous Si, C, H alloys; amorphous Si, N, C, H alloys; Si, C, O, H alloys; Si, N, C, O, H alloys; boron nitride (BN); insulating metal carbides (MC) and nitrides (MN); and alloys of M, Si and N, wherein M is a metal selected from the group consisting of Ti, Ta, W, Zr and Al.

When more than one low-permeability dielectric film is employed, the low-permeability films of the dielectric stack may comprise the same or different inorganic dielectric, with preference given to using the same inorganic dielectric as the low-permeability dielectric in the dielectric stack. The thickness of each low-permeability dielectric film present in the diffusion barrier of the present invention is typically about 12 nm or less, with a thickness for each low-permeability dielectric of from about 5 to about 10 nm being more highly preferred.

In one embodiment of the present invention, two low-permeability layers are combined with two high-permeability (low-density) dielectrics. The low-permeability layers include any of the aforementioned low-permeability dielectrics in the form of a high-density film. Each low-permeability film in this embodiment is thin (on the order of about 5 nm), and the thickness can be adjusted within the range of from about 2 to about 12 nm. The layer contacting the substrate is the first low-permeability film, which preferably has a strong adhesion to the substrate. Between these are high-permeability films each composed of one of the above-mentioned dielectrics. Each high-permeability layer is about 5 to about 20 nm thick, although this can be adjusted. The final layer of the diffusion barrier contacting the oxidizing environment is the second high-permeability layer.

The present invention also contemplates the following embodiments which are similar to the one mentioned above: Two low-permeability layers and one high-permeability layer (three total layers); and three low-permeability layers and two high-permeability layers (total five layers). Although the above specific embodiments are mentioned, the present invention works in cases wherein any number of alternating low-permeability and high-permeability layers is employed.

Referring again to FIG. 2, in another inventive diffusion barrier, dielectrics having a low-dielectric constant (on the order of about 4 or less) and having barrier properties towards $O_2$, $H_2O$, and Cu diffusion are combined. The low-permeability layers (reference numeral 12 in FIG. 2) are composed of Si, C, O, N and H, in the form of a high-density film without free volume in the film. Each low-permeability layer is thin, about 2 to 5 nm, and this thickness can be adjusted. The layer contacting the substrate is the first low-permeability layer, which has a strong adhesion to the substrate, preferably greater than about 20 J/m² as measured by a standard bending beam adhesion test.

Between these are high-permeability layers (item 14 in FIG. 2) each composed of Si, C, O and H, and some free volume (i.e., nano-scale voids) are contained within the film (resulting in a low-dielectric constant of about 2.7 to about 3 for each of the high-permeability layers). Each high-permeability layer is about 3 to about 12 nm thick, although this can be adjusted. The final layer of diffusion barrier layer contacting the oxidizing environment is the sixth low-permeability layer.

The dielectric stack of the inventive diffusion barrier is prepared by depositing at least two or more alternating high/low permeability dielectric films on a surface of a substrate containing at least one metal wiring region. Specifically, the dielectric stack is formed utilizing the same or different deposition process which is selected from the group consisting of chemical vapor deposition (CVD), low-pressure CVD, plasma-assisted CVD, atomic layer deposition (ALD), evaporation, spin coating, chemical solution deposition and sputtering. Of the deposition processes mentioned hereinabove, it is highly preferred that the dielectric stack be formed by a low-pressure CVD process whose reaction pressure is below about 50 torr.

The dielectric stack may be formed in a single deposition reaction chamber; or alternatively multiple deposition reaction chambers may be used in forming the dielectric stack. It is preferred in the present invention that the dielectric stack be formed in the same deposition reaction chamber wherein the different dielectric films are obtained by changing the deposition gas chemistry.

The exact conditions used for the formation of the dielectric stack may vary depending on the exact deposition process and deposition reactant gases employed. Typically, however standard deposition conditions and reactant gases that are well known in the art are employed in the present invention.

The structure of FIG. 2 may be deposited, for example, in a single multi-station PECVD tool (such as a Novellus Sequel tool, which has six stations for sequential deposition on a single substrate). The substrate is indexed from the first station to the sixth station with one or two layers of the inventive barrier being deposited at each station. The substrate temperature is from about 250° to about 500° C., with a substrate temperature of from about 350° to about 400° C. being more highly preferred. The cyclic precursor TMCTS (tetramethylcyclotetrasiloxane) which contains Si, C and O in equal quantities is one deposition precursor. Additional gases include $NH_3$ and a carrier gas such as $CO_2$ or He.

The substrate is placed in station one of the tool, and a cleaning step may be performed to achieve strong adhesion. Gases including $H_2$, $NH_3$ and the like are introduced, and a plasma is formed for about 3 to about 60 seconds, and Cu oxide is removed from the top surface of the patterned Cu features. Then, a first high-permeability layer is deposited using conditions given below for a time period of about 3 to about 5 seconds. Still at station one, the deposition gases are pumped out, and a plasma densification step is performed with a $NH_3$ plasma using an energy of about 100 to about 500 Watts for about 10 to about 20 seconds. The $NH_3$ plasma converts a surface layer of the first high-permeability layer into a dense alloy of Si, C, O, N and H, and thus forms the first low-permeability layer.

The substrate is then moved to the second station, and the above deposition step is repeated depositing a second high-permeability layer. The deposition gases are again pumped out and $NH_3$ plasma densification is repeated forming the second low permeability layer.

The substrate is then moved to stations 3, 4, 5 and 6, and at each station the deposition step, and the densification step is performed.

As stated above, the dielectric stack is typically formed on a surface of a substrate having at least one wiring region therein. A typical substrate containing the inventive diffusion barrier of the present invention is shown, for example, by FIG. 3. Specifically, the structure shown in FIG. 3 comprises substrate 20 having wiring regions 22 therein. The substrate is typically comprised of an interconnect structure which includes dielectrics surrounding the wiring regions. For clarity the dielectrics surrounding the wiring regions are not specifically labeled, but are meant to be included within region 20. The substrate also includes a semiconductor chip or wafer that underlies the interconnect level. Again for clarity, the semiconductor chip or wafer is not specifically labeled, but is meant to be included within region 20.

Figure 3:
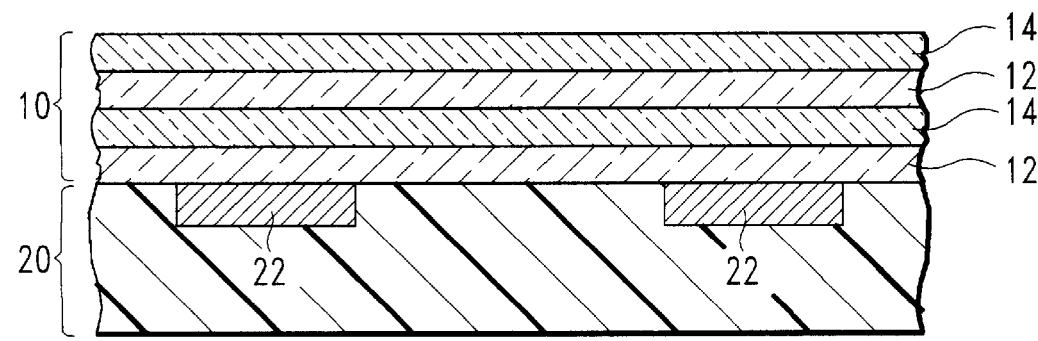
FIG. 3 is a cross-sectional view of a semiconductor structure which includes wiring regions and the inventive diffusion barrier.

The interconnect structure may include a dual damascene structure or a single damascene, each of which are prepared using conventional techniques well known to those skilled in the art. The dielectric of the interconnect structure in FIG. 3 is typically composed of an organic dielectric material that has a dielectric constant of less than about 4, preferably from about 2 to about 3. Illustrative examples of typically organic dielectrics that may be present in the interconnect structure include, but are not limited to: polyarylene ethers; thermosetting polyarylene ethers; aromatic thermosetting resins; polyimides; Si-containing polymers; benzocyclobutenes; polynorboranes; parylene copolymers; parylene-F; polynapthalene; polytetrafluoronaphthalene; poly(octafluoro-bis-benzocyclobutene); Telfon-AF; fluorinated-amorphous carbon; Xerogels and nanoporous silica. Note that the organic dielectric may be composed of the same or different organic dielectric as the high-permeability films of the inventive diffusion barrier.

It is also noted that some low-k inorganic dielectrics also contemplated herein as the material for the interlevel dielectric. Examples of inorganic dielectrics include, but are not limited to: amorphous Si, C, O, H alloys deposited by CVD (either with or without plasma), also known as carbon doped oxide, for example, Black Diamond from Applied Material, and Coral from Novellus. Also, spin-on inorganics such as the silsesquioxane HOSP sold by Honeywell; methlsilsesquioxane (MSQ); hydrido silsesquioxane (HSQ); MSQ-HSQ copolymers; TEOS (tetraethylorthosilicate) and other silanes and Si-containing dielectrics may be employed as the interlevel dielectric.

Insofar as the wiring regions are concerned, those regions, which include metal lines and vias, are composed of a conductive material that is selected from the group consisting of Al, Cu, W, Ti and alloys or multilayers thereof. Of these conductive materials, it is preferred that the wiring regions be composed of Al or Cu.

The diffusion barrier is then formed on top of the substrate using the processing techniques mentioned-above. In this figure, the diffusion barrier is composed of dielectric stack 10 having four sub-dielectrics films layers as shown in FIG. 1.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms described and illustrated herein, but fall within the scope of the appended claims.

Having thus described our invention in detail, what we claim is new and desire to secure by the Letters Patent is:

1. A diffusion barrier formed on a substrate, said diffusion barrier comprising a dielectric stack having at least two dielectric films, each film having a dielectric constant of about 8 or less, wherein said dielectric stack comprises alternating films composed of a first material and a second material,
wherein
said first material is disposed on one surface of the substrate and in contact therewith,
the substrate includes a semiconductor wafer,
said first material is characterized as a low-permeability material effective to retard diffusion of at least one of oxygen and water vapor,
said second material is characterized as a high-permeability material less effective than said first material to retard diffusion of at least one of oxygen and water vapor, and
said second material has a dielectric constant less than about 4.

2. The diffusion barrier of claim 1 wherein said dielectric constant of each film is from about 3 to about 5.

3. The diffusion barrier of claim 1 wherein said high-permeability material is selected from the group consisting of polyarylene ethers; aromatic thermosetting resins; Si-containing polymers; benzocyclobutenes; polynorboranes; parylene copolymers; parylene-F; polynapthalene; polytetrafluoronapthalene; poly(octafluoro-bis-benzocyclobutene); Teflon-AF; fluorinated-amorphous carbon; Xerogels and nanoporous silica.

4. The diffusion barrier of claim 3 wherein said high-permeability material is a low-density amorphous film comprised of one of (1) an alloy of Si, C, H optionally containing N and (2) SiCOH optionally containing N.

5. The diffusion barrier of claim 1 wherein said low-permeability material is selected from the group consisting of $Si_3N_4$; amorphous Si, N, H alloys; $Al_2O_3$; amorphous Si, C, H alloys; amorphous Si, N, C, H alloys; Si, C, O, H alloys; Si, N, C, O, H alloys; boron nitride (BN); insulating metal carbides (MC) and nitrides (MN); and alloys of M, Si and N, wherein M is a metal selected from the group consisting of Ti, Ta, W, Zr and Al.

6. The diffusion barrier of claim 5 wherein said low-permeability material is $Si_3N_4$, $Al_2O_3$, alloys of Si, C, H or alloys of Si, C, N, H.

7. The diffusion barrier of claim 1 wherein said dielectric stack comprises three or more dielectric films.

8. The diffusion barrier of claim 1 wherein said dielectric comprises twelve dielectric films.

9. A semiconductor structure comprising a substrate having at least one metal region formed therein and a diffusion barrier formed on a surface of said substrate, wherein said diffusion barrier comprises a dielectric stack having at least two dielectric films, each film having a dielectric constant of about 8 or less, wherein said dielectric stack comprises alternating films composed of a first material and a second material,
wherein
said first material is disposed on one surface of the substrate and in contact therewith,
the substrate includes a semiconductor wafer,
said first material is characterized as a low-permeability material effective to retard diffusion of at least one of oxygen and water vapor,
said second material is characterized as a high-permeability material less effective than said first material to retard diffusion of at least one of oxygen and water vapor, and said second material has a dielectric constant less than about 4.

10. The semiconductor structure of claim 9 wherein said substrate includes an interconnect structure.

11. The semiconductor structure of claim 9 wherein said at least one metal wiring region is composed of a conductive metal selected from the group consisting of Al, Cu, W, Ti and alloys thereof.

12. The semiconductor structure of claim 11 wherein said at least one metal wiring region is composed of Al or Cu.

13. The semiconductor structure of claim 9 wherein said dielectric constant of each film is from about 3 to about 5.

14. The semiconductor structure of claim 9 wherein said high-permeability material is selected from the group consisting of polyarylene ethers; aromatic thermosetting resins; Si-containing polymers; benzocyclobutenes; polynorboranes; parylene copolymers; parylene-F; polynapthalene; polytetrafluoronapthalene; poly(octafluoro-bis-benzocyclobutene); Teflon-AF; fluorinated-amorphous carbon; Xerogels and nanoporous silica.

15. The semiconductor structure of claim 14 wherein said high-permeability material is a low-density amorphous film comprised of one of (1) an alloy of Si, C, H optionally containing N and (2) SiCOH optionally containing N.

16. The semiconductor structure of claim 9 wherein said low-permeability material is selected from the group consisting of $Si_3N_4$; amorphous Si, N, H alloys; $Al_2O_3$; amorphous Si, C, H alloys; amorphous Si, N, C, H alloys; Si, C, O, H alloys; Si, N, C, O, H alloys; boron nitride (BN); insulating metal carbides (MC) and nitrides (MN); and alloys of M, Si and N, wherein M is a metal selected from the group consisting of Ti, Ta, W, Zr and Al.

17. The semiconductor structure of claim 16 wherein said low-permeability material is $Si_3N_4$, $Al_2O_3$, alloys of Si, C, H or alloys of Si, C, N, H.

18. The semiconductor structure of claim 9 wherein said dielectric stack comprises three or more dielectric films.

19. The semiconductor structure of claim 9 wherein said dielectric comprises twelve dielectric films.

* * * * *